(12) United States Patent
Park

(10) Patent No.: US 8,004,916 B2
(45) Date of Patent: Aug. 23, 2011

(54) SEMICONDUCTOR CIRCUIT

(75) Inventor: Jin-Ho Park, Uljeonghu-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 302 days.

(21) Appl. No.: 12/248,147

(22) Filed: Oct. 9, 2008

(65) Prior Publication Data

US 2009/0190424 A1 Jul. 30, 2009

(30) Foreign Application Priority Data

Dec. 24, 2007 (KR) .................. 10-2007-0135988

(51) Int. Cl.
*G11C 7/00* (2006.01)

(52) U.S. Cl. ........................ 365/203; 365/207

(58) Field of Classification Search .................. 365/203, 365/207, 189.04

See application file for complete search history.

(56) References Cited

U.S. PATENT DOCUMENTS

| 6,034,884 | A | * | 3/2000 | Jung | 365/145 |
| 7,539,064 | B2 | * | 5/2009 | Lee | 365/185.24 |
| 2007/0002653 | A1 | * | 1/2007 | Jung et al. | 365/203 |

FOREIGN PATENT DOCUMENTS

KR 100656452 12/2006

* cited by examiner

*Primary Examiner* — Anh Phung

(74) *Attorney, Agent, or Firm* — Sherr & Vaughn, PLLC

(57) ABSTRACT

Embodiments relate to semiconductor devices and methods for fabricating semiconductor devices. According to embodiments, a semiconductor device may include a bit line and a bit line bar. The device may also include a precharge controller that may generate a precharge control signal, and NMOS transistors and PMOS transistors to precharge the bit line and the bit line bar in response to the precharge control signal. According to embodiments, a precharge speed of a bit line in a semiconductor device may be improved and an operating cycle time of a memory device may also be improved.

15 Claims, 4 Drawing Sheets

SEMICONDUCTOR CIRCUIT

The present application claims priority under 35 U.S.C. 119 to Korean Patent Application No. 10-2007-0135988 (filed on Dec. 24, 2007), which is hereby incorporated by reference in its entirety.

BACKGROUND

A memory operation may include amplifying data stored in respective memory cells through a sense amplifier according to a read command or write command in a state that a bit line and a data line are precharged to a given voltage and to output the data to the outside, or to transfer data input from the outside to data line by using a data write driver and then store the data in a memory cell selected through bit line.

When a read or write operation of the memory is completed, a bit line and a data line should be charged again to a given voltage to be capable of performing a subsequent memory operation.

Hence, to obtain a high speed operation of a memory device, a speed in a read operation and write operation should be optimized. In addition, a speed in a precharge of bit line before and/or after the read and write operation should also be optimized.

SUMMARY

Embodiments relate to a semiconductor circuit that may include a precharge circuit to improve a precharge speed of bit line.

According to embodiments, a semiconductor circuit may include a bit line and a bit line bar. It may also include a precharge controller to generate a precharge control signal, and NMOS transistors and PMOS transistors to precharge the bit line and the bit line bar in response to the precharge control signal.

According to embodiments, a precharge speed of a bit line in a semiconductor circuit may be optimized and an operating cycle time of a memory device may also be optimized.

DRAWINGS

Figure 1:
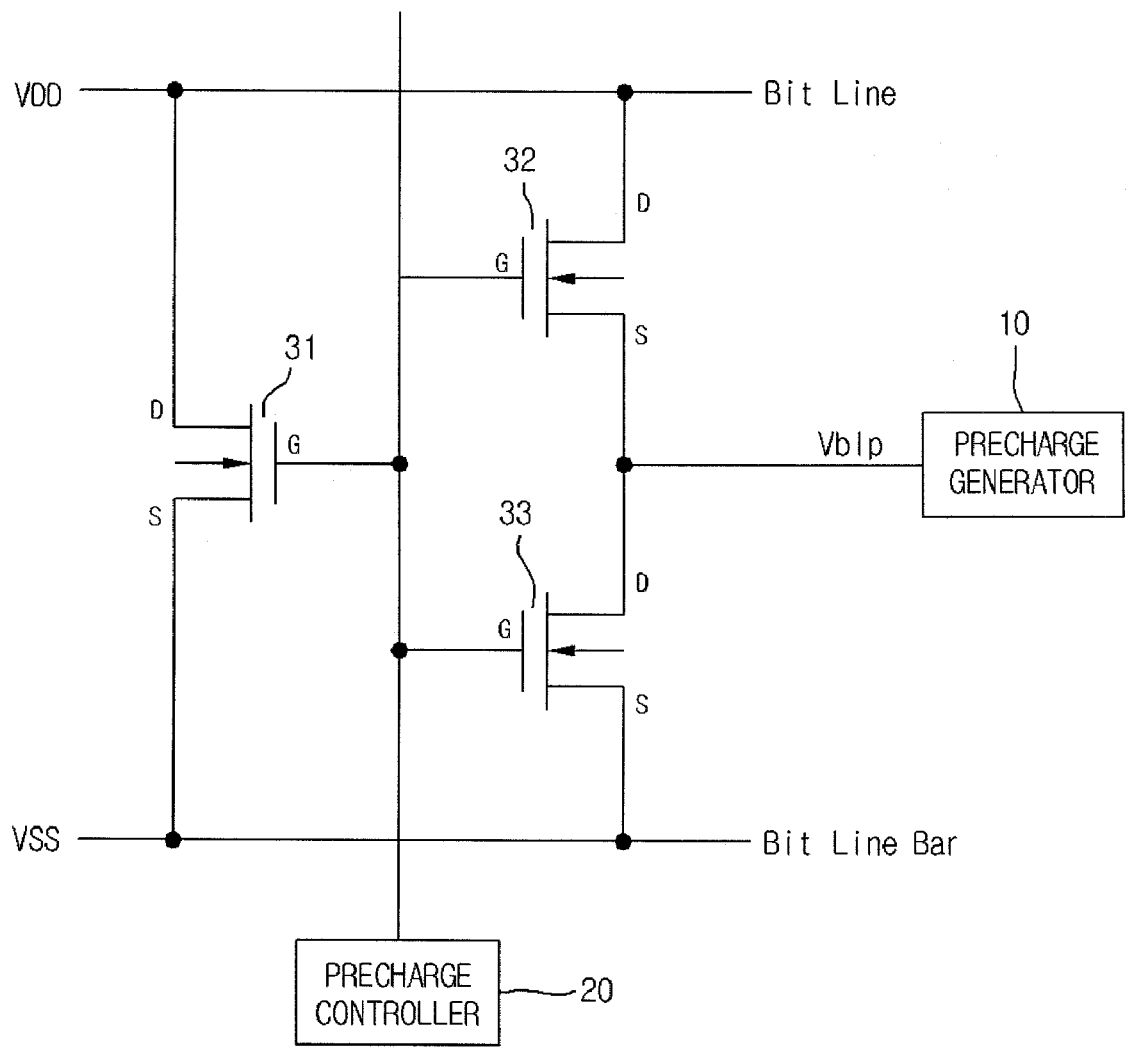

Example FIG. 1 is a circuit diagram of bit line precharge voltage generating device according to embodiments.

Figure 2:
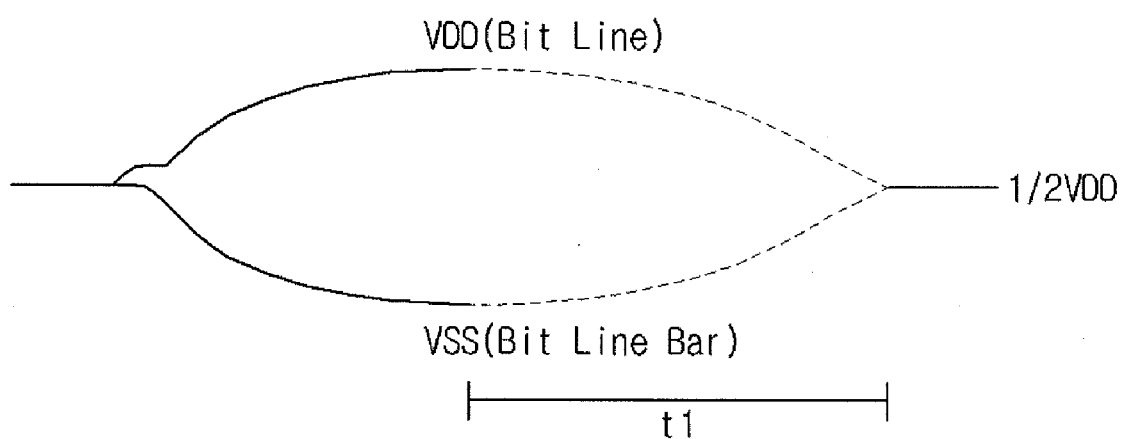

Example FIG. 2 is a graph illustrating a precharge drive of the bit line precharge voltage generating device shown in Example FIG. 1.

Figure 3:
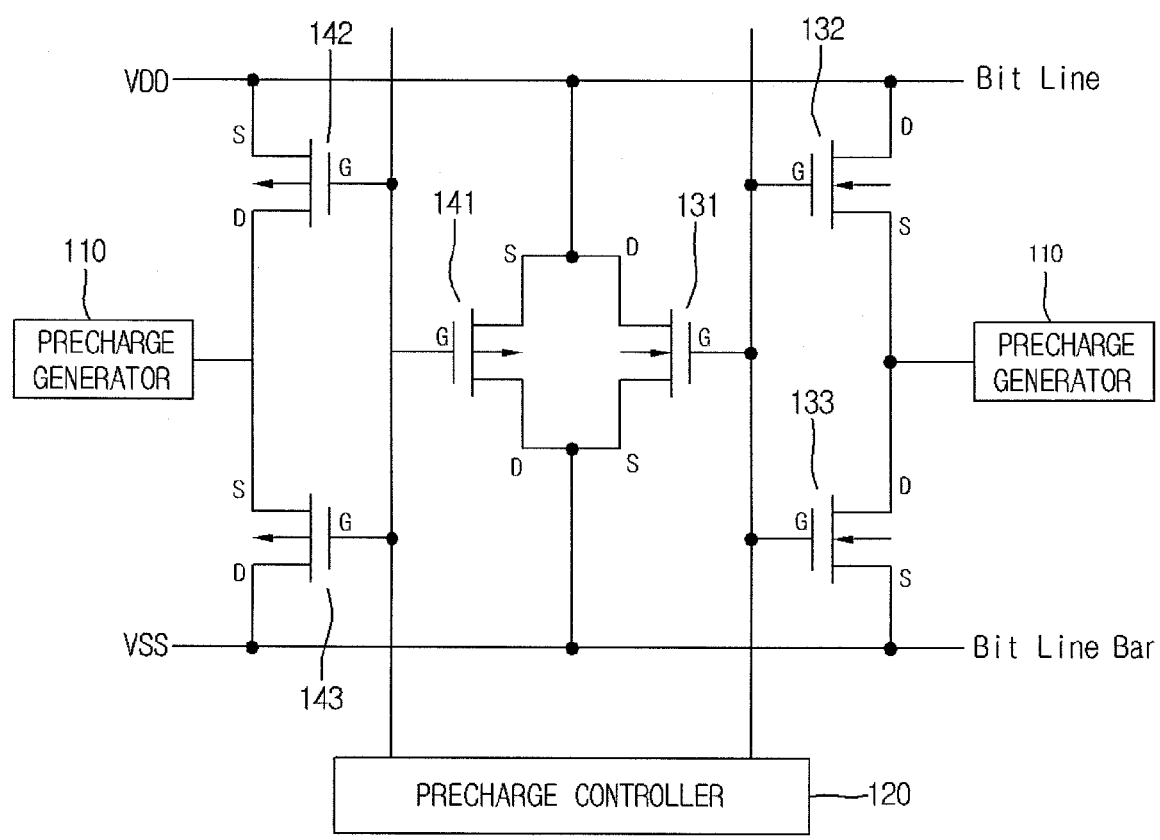

Example FIG. 3 is a circuit diagram of precharge circuit in a semiconductor device according to embodiments.

Figure 4:
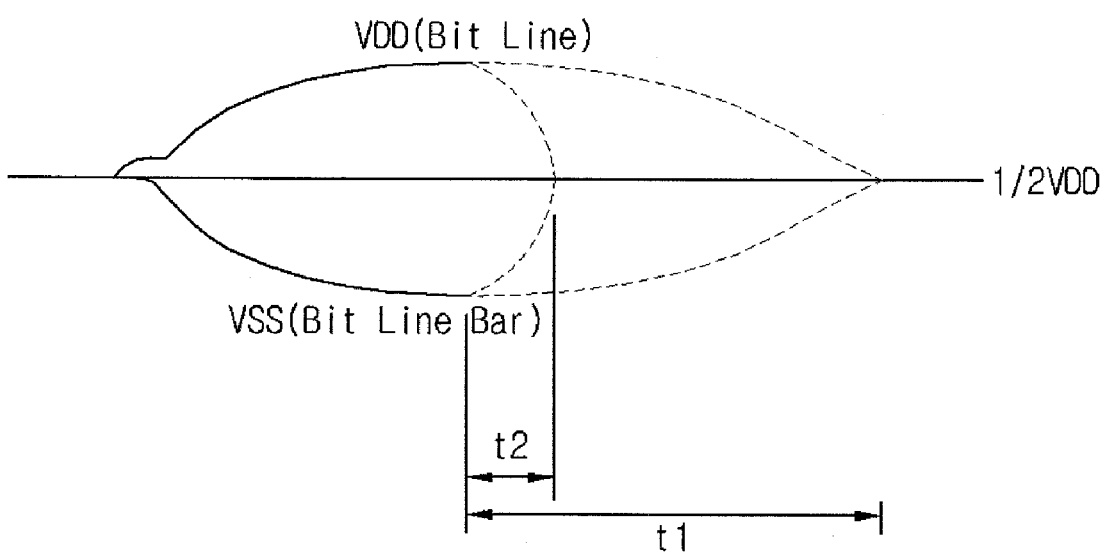

Example FIG. 4 is a graph illustrating operation of precharge circuit according to embodiments.

DESCRIPTION

Hereinafter, a semiconductor device is described referring to the accompanying drawings.

Example FIG. 1 illustrates a bit line precharge voltage generating device according to embodiments. Example FIG. 2 is a graph illustrating a precharge drive of the bit line precharge voltage generating device shown in Example FIG. 1.

Referring to example FIG. 1, a bit line precharge voltage generating device according to embodiments may include a bit line to which power source voltage VDD may be applied. The device may also include a bit line bar to which ground power VSS may be applied. The device may also include a precharge circuit. According to embodiments, precharge circuit may include NMOS transistors 31, 32 and 33 to output through a ½ VDD precharge voltage Vblp when the bit line and the bit line bar are in a standby state. Precharge circuit may also include precharge generator 10, which may output a precharge voltage in the precharge circuit, and precharge controller 20, which may operate and control the precharge circuit.

Referring to example FIGS. 1 and 2, according to embodiments, a Vblp potential may be applied to bit line and bit line bar using three NMOS transistors 31, 32 and 33 before and/or after an operation of core cell. According to embodiments, after a read operation of data in a cell is completed, a precharge operation for a subsequent read or write may be performed using Vblp. By using the NMOS transistor, current may flow from a logic high level to a logic low level to precharge bit line and bit line bar.

Example FIG. 3 is a circuit diagram of precharge circuit in a semiconductor device according to embodiments. Example FIG. 4 is a graph illustrating an operation of precharge circuit according to embodiments.

Referring to FIG. 3, bit line may be provided to which power source voltage VDD may be applied. Bit line bar may also be provided, to which ground power VSS may be applied. There may further be provided a precharge circuit. According to embodiments, precharge circuit may include PMOS transistors 141, 142 and 143 and NMOS transistors 131, 132 and 133 for an output through a ½ VDD precharge voltage Vblp when the bit line and the bit line bar are in a standby state. Precharge circuit may further include precharge generator 110, which may be configured to output a precharge voltage in precharge circuit, and precharge controller 120, which may be configured to operate and control precharge circuit.

According to embodiments, a current flow from a logic low level to a logic high level may be produced by using PMOS transistors 141, 142 and 143 configured between bit line and bit line bar. A current flow from a logic high level to a logic low level may be produced by using the NMOS transistors 131, 132 and 133 configured between bit line and bit line bar. This may reduce a precharge time to achieve a precharge of ½ VDD and may improve a cycle time for a high speed operation. According to embodiments, bit line may be a longest line within a memory cell array. Hence, parasitic capacitance of bit line may be large. This may cause a delay in precharging. For example, when not precharged to a desired precharge voltage level, an error may occur when reading data. According to embodiments, however, precision in reading data may increase by rapidly precharging a bit line. According to embodiments, time to arrange a subsequent memory operation may be reduced. Operation of a semiconductor device at a high speed may be optimized.

According to embodiments, precharge generator 110 may be a constant voltage generator, or any voltage generator, to provide bit line and bit line bar with a precharge voltage of approximately ½ VDD. According to embodiments, precharge controller 120 may be a circuit group and may prevent an error operation for bit line and bit line bar in operation of a memory cell, in a word line on/off, sense amplifier operation, bit line/bit line bar precharge and floating time, and other operations known in the art. According to embodiments of a precharge circuit, first and second NMOS transistors 131 and 132 may be provided and may couple to bit line to bit line bar. According to embodiments, first and second PMOS transistors 141 and 142 may also be provided and may couple to bit line to bit line bar. First and second NMOS transistors 131 and 132 may be disposed in series, and first and second PMOS transistors 141 and 142 may be disposed in series.

According to embodiments, third NMOS transistor 133 may also be provided and may be configured such that a gate of first NMOS transistor 131 and a gate of second NMOS transistor 132 are coupled. According to embodiments, third PMOS transistor 143 may also be provided, and may be configured such that a gate of first PMOS transistor 141 and a gate of second PMOS transistor 142 may be coupled. Sources and drains may be mutually coupled in third NMOS transistor 133 and third PMOS transistor 143. A drain of third NMOS transistor 133 and a source of third PMOS transistor 143 may be coupled to VDD. A source of third NMOS transistor 133 and a drain of third PMOS transistor 143 may be coupled to VSS. According to embodiments, precharge controller 120 may apply a control signal to the gate of first, second, and third NMOS transistors 131, 132, and 133 and first, second, and third PMOS transistors 141, 142, and 143. A layout of first, second, and third PMOS transistors 141, 142, and 143 may be configured as a mirror type of the layout of first, second, and third NMOS transistors 131, 132 and 133.

With reference to example FIG. 4, a precharge circuit may include NMOS transistors 131, 132, and 133 and PMOS transistors 141, 142, and 143. In such a configuration, current flow may be induced in both directions for voltage of bit line and bit line bar. This may precharge two lines to a voltage of the same level (approximately ½ VDD) within time t2. Time t2 may be more rapid than time t1, which represents a precharge time by a precharge circuit including only NMOS transistors. Hence, a precharge time may be reduced for a subsequent cell operation, which may improve an operation cycle time.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A device comprising:
   a bit line and a bit line bar;
   a precharge controller configured to generate a precharge control signal; and
   a plurality of NMOS transistors and a plurality of PMOS transistors configured to precharge the bit line and the bit line bar in response to the precharge control signal,
   wherein the plurality of NMOS transistors comprise:
      a first NMOS transistor coupled to the bit line;
      a second NMOS transistor coupled to the bit line bar; and
      a third NMOS transistor coupled to gates of the first and second NMOS transistors, and
   wherein the plurality of PMOS transistors comprises:
      a first PMOS transistor coupled to the bit line;
      a second PMOS transistor coupled to the bit line bar; and
      a third PMOS transistor coupled to gates of the first and second PMOS transistors.

2. The device of claim 1, wherein a drain of the third NMOS transistor is coupled to a power source voltage and a source of the third NMOS transistor is coupled to ground power.

3. The device of claim 1, wherein the precharge control signal is input to gates of the first, second, and third NMOS transistors.

4. The device of claim 1, wherein a drain of the first NMOS transistor is coupled to the bit line, and a source of the first NMOS transistor is coupled to a drain of the second NMOS transistor, and a source of the second NMOS transistor is coupled to the bit line bar.

5. The device of claim 1, wherein a source of the first NMOS transistor and a drain of the second NMOS transistor are coupled to a precharge generator.

6. The device of claim 1, wherein a drain of the first NMOS transistor is coupled to power source voltage and a source of the second NMOS transistor is coupled to ground power.

7. The device of claim 1, wherein a source of the third PMOS transistor is coupled to power source voltage and a drain of the third PMOS transistor is coupled to ground power, and wherein the precharge control signal is input to gates of the first, second, and third PMOS transistors.

8. The device of claim 1, wherein a source of the first PMOS transistor is coupled to the bit line, a drain of the first PMOS transistor is coupled to a source of the second PMOS transistor, and a drain of the second PMOS transistor is coupled to the bit line bar.

9. The device of claim 8, wherein the drain of the first PMOS transistor and the source of the second PMOS transistor are coupled to a precharge generator.

10. The device of claim 9, wherein the plurality of NMOS transistors comprises a first NMOS transistor coupled with the bit line, a second NMOS transistor coupled to the bit line bar, and a third NMOS transistor coupled to gates of the first and second NMOS transistors, and wherein a drain of the third NMOS transistor is coupled to power source voltage and a source of the third NMOS transistor is coupled to ground power.

11. The device of claim 10, wherein a drain of the first NMOS transistor is coupled to the bit line, a source of the first NMOS transistor is coupled to a drain of the second NMOS transistor, and a source of the second NMOS transistor is coupled to the bit line bar, and wherein the precharge controller is coupled to the gates of the first and second NMOS transistors and to a gate of the third NMOS transistor.

12. The device of claim 11, wherein the source of the first NMOS transistor and the drain of the second NMOS transistor are coupled to a precharge generator.

13. The device of claim 11, wherein the plurality of PMOS transistors produce a current flow of from a logic low level to a logic high level between the bit line and the bit line bar, and the plurality of NMOS transistors produce a current flow of from a logic high level to a logic low level between the bit line and the bit line bar, to provide the bit line and the bit line bar with a precharge voltage of one half of the power source voltage.

14. The device of claim 1, wherein the NMOS transistors and the PMOS transistors are disposed in a mirror type structure.

15. The device of claim 1, wherein the PMOS transistors produce a current flow of from a logic low level to a logic high level between the bit line and the bit line bar, and the NMOS transistors produce a current flow of from a logic high level to a logic low level between the bit line and the bit line bar, thereby providing the bit line and the bit line bar with a precharge voltage of one half of a power source voltage.

* * * * *